(12) United States Patent
Kim et al.

(10) Patent No.: US 12,381,070 B2
(45) Date of Patent: Aug. 5, 2025

(54) SUBSTRATE TREATMENT APPARATUS AND SEMICONDUCTOR DEVICE MANUFACTURING METHOD USING THE SAME

(71) Applicant: Samsung Electronics Co., Ltd., Suwon-si (KR)

(72) Inventors: Jihwan Kim, Suwon-si (KR); Nam Kyun Kim, Suwon-si (KR); Hyun Bae Kim, Suwon-si (KR); Seungbo Shim, Suwon-si (KR); Hyeongmo Kang, Suwon-si (KR); Kyung-Sun Kim, Suwon-si (KR); Daeun Son, Suwon-si (KR); Juho Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 160 days.

(21) Appl. No.: 18/241,862

(22) Filed: Sep. 2, 2023

(65) Prior Publication Data
US 2024/0258081 A1 Aug. 1, 2024

(30) Foreign Application Priority Data
Feb. 1, 2023 (KR) .................. 10-2023-0013771

(51) Int. Cl.
*H01J 37/32* (2006.01)
(52) U.S. Cl.
CPC .. *H01J 37/32715* (2013.01); *H01J 37/32174* (2013.01); *H01J 37/32568* (2013.01)

(58) Field of Classification Search
CPC .......... H01J 37/32715; H01J 37/32174; H01J 37/32568
See application file for complete search history.

(56) References Cited

U.S. PATENT DOCUMENTS

| | | | | |
|---|---|---|---|---|
| 5,187,457 A | * | 2/1993 | Chawla | H03H 7/07 333/170 |
| 5,479,389 A | * | 12/1995 | Ann | G11B 7/0953 369/47.39 |
| 6,841,943 B2 | | 1/2005 | Vahedi et al. | |
| 8,821,684 B2 | | 9/2014 | Ui et al. | |
| 9,208,992 B2 | | 12/2015 | Brouk et al. | |
| 10,373,804 B2 | | 8/2019 | Koh et al. | |
| 10,811,267 B2 | | 10/2020 | Tokashiki | |

(Continued)

FOREIGN PATENT DOCUMENTS

| | | | | |
|---|---|---|---|---|
| JP | 2000315682 A | * | 11/2000 | ............ B23K 10/00 |
| KR | 102593140 B1 | * | 10/2023 | |
| KR | 20230151714 A | * | 11/2023 | |

*Primary Examiner* — Adam D Houston
(74) *Attorney, Agent, or Firm* — Muir Patent Law, PLLC

(57) ABSTRACT

A substrate treatment apparatus may include a chucking stage supporting a substrate, a sinusoidal generator supplying a sinusoidal wave to the chucking stage, a non-sinusoidal generator supplying a non-sinusoidal wave to the chucking stage, and a mixer between each of the sinusoidal and non-sinusoidal generators and the chucking stage. The chucking stage may include a chuck body and a plasma electrode in the chuck body. The mixer may include a high pass filter between the sinusoidal generator and the plasma electrode, a low pass filter between the non-sinusoidal generator and the plasma electrode, and a band stop filter between the low pass filter and the plasma electrode.

20 Claims, 9 Drawing Sheets

(56) References Cited

U.S. PATENT DOCUMENTS

| | | | |
|---|---|---|---|
| 10,811,296 B2 | 10/2020 | Cho et al. | |
| 11,948,780 B2* | 4/2024 | Cui | H01J 37/32715 |
| 12,198,966 B2* | 1/2025 | Kraus | H01L 21/67109 |
| 12,205,823 B2* | 1/2025 | Takasaki | H01L 21/31116 |
| 12,230,484 B2* | 2/2025 | Harikai | H01J 37/32733 |
| 12,255,051 B2* | 3/2025 | Cui | H01J 37/32128 |
| 2016/0247666 A1* | 8/2016 | Urakawa | H01J 37/32174 |
| 2018/0033594 A1* | 2/2018 | Gu | H01J 37/32091 |
| 2018/0240697 A1* | 8/2018 | Okita | H01J 37/32816 |
| 2019/0096636 A1* | 3/2019 | Nam | H01J 37/32128 |
| 2019/0393017 A1* | 12/2019 | Kang | H01L 21/32137 |
| 2020/0168437 A1* | 5/2020 | Ziemba | H01J 37/32706 |
| 2020/0173027 A1* | 6/2020 | Takeda | H01L 21/67017 |
| 2022/0139673 A1* | 5/2022 | Kim | H01J 37/32642 |
| | | | 156/345.3 |
| 2023/0253232 A1* | 8/2023 | Tsuji | H01J 37/32724 |
| | | | 118/723 R |
| 2024/0258081 A1* | 8/2024 | Kim | H01J 37/32568 |
| 2025/0046576 A1* | 2/2025 | Guo | H01J 37/32706 |

\* cited by examiner

SUBSTRATE TREATMENT APPARATUS AND SEMICONDUCTOR DEVICE MANUFACTURING METHOD USING THE SAME

CROSS-REFERENCE TO RELATED APPLICATION(S)

This U.S. non-provisional patent application claims priority under 35 U.S.C. § 119 to Korean Patent Application No. 10-2023-0013771, filed on Feb. 1, 2023, in the Korean Intellectual Property Office, the disclosure of which is hereby incorporated by reference in its entirety.

BACKGROUND OF THE INVENTION

The present disclosure relates to a substrate treatment apparatus and a method of manufacturing a semiconductor device using the same, and in particular, to a substrate treatment apparatus, which is configured to apply sinusoidal and non-sinusoidal waves to a single electrode, and a method of manufacturing a semiconductor device using the same.

Semiconductor devices are fabricated through various processes. In detail, semiconductor devices are fabricated by performing a photolithography process, an etching process, and a deposition process on a wafer. Various fluidic materials are used in these processes. Plasma may be used in an etching process and/or a deposition process. An electrode is used to produce and/or control the plasma, during the process. In general, one or more electrodes may be used in a plasma-based process on a substrate, however, it is desired to prevent an interference issue which may occur when two electrodes are used.

SUMMARY

Example embodiments of the inventive concept provide a substrate treatment apparatus, which is configured to supply sinusoidal and non-sinusoidal waves to a single electrode, and a substrate treatment method using the same.

An embodiment of the inventive concept provides a substrate treatment apparatus, which is configured to suppress a harmonic wave, and a substrate treatment method using the same.

An embodiment of the inventive concept provides a substrate treatment apparatus, which is configured to prevent sinusoidal and non-sinusoidal waves from being leaked, and a substrate treatment method using the same.

An embodiment of the inventive concept provides a substrate treatment apparatus, which is configured to perform various operations without additional control, and a substrate treatment method using the same.

According to an embodiment of the inventive concept, a substrate treatment apparatus may include a chucking stage supporting a substrate, a sinusoidal generator supplying a sinusoidal wave to the chucking stage, a non-sinusoidal generator supplying a non-sinusoidal wave to the chucking stage, and a mixer between each of the sinusoidal and non-sinusoidal generators and the chucking stage. The chucking stage may include a chuck body and a plasma electrode in the chuck body. The mixer may include a high pass filter between the sinusoidal generator and the plasma electrode, and configured to receive the sinusoidal wave from the sinusoidal generator and transmit the sinusoidal wave to the plasma electrode, a low pass filter between the non-sinusoidal generator and the plasma electrode, and configured to receive the non-sinusoidal wave from the non-sinusoidal generator, and a band stop filter between the low pass filter and the plasma electrode, and configured to receive the non-sinusoidal wave from the low pass filter and transmit the non-sinusoidal wave to the plasma electrode.

According to an embodiment of the inventive concept, a substrate treatment apparatus may include a substrate treatment chamber providing a process space, a chucking stage placed in the substrate treatment chamber, supporting a substrate, and including a plasma electrode, a sinusoidal generator supplying a sinusoidal wave to the plasma electrode, a non-sinusoidal generator supplying a non-sinusoidal wave to the plasma electrode, and a mixer connected to each of the sinusoidal and non-sinusoidal generators. The mixer may include a low pass filter between the non-sinusoidal generator and the plasma electrode, and configured to receive the non-sinusoidal wave from the non-sinusoidal generator, and a band stop filter between the low pass filter and the plasma electrode, and configured to receive the non-sinusoidal wave from the low pass filter.

According to an embodiment of the inventive concept, a method of manufacturing a semiconductor device may include placing a substrate in substrate treatment apparatus, supplying a non-sinusoidal wave to a plasma electrode of the substrate treatment apparatus, and supplying a sinusoidal wave to the plasma electrode. The supplying of the non-sinusoidal wave to the plasma electrode may include transmitting the non-sinusoidal wave, which is generated by a non-sinusoidal generator, to the plasma electrode through a mixer. The supplying of the sinusoidal wave to the plasma electrode may include transmitting the sinusoidal wave, which is generated by a sinusoidal generator, to the plasma electrode through the mixer. The transmitting of the non-sinusoidal wave to the plasma electrode through the mixer may include allowing the non-sinusoidal wave, which is generated by the non-sinusoidal generator, to pass through a low pass filter and band a stop filter in the mixer.

DETAILED DESCRIPTION

Figure 1:
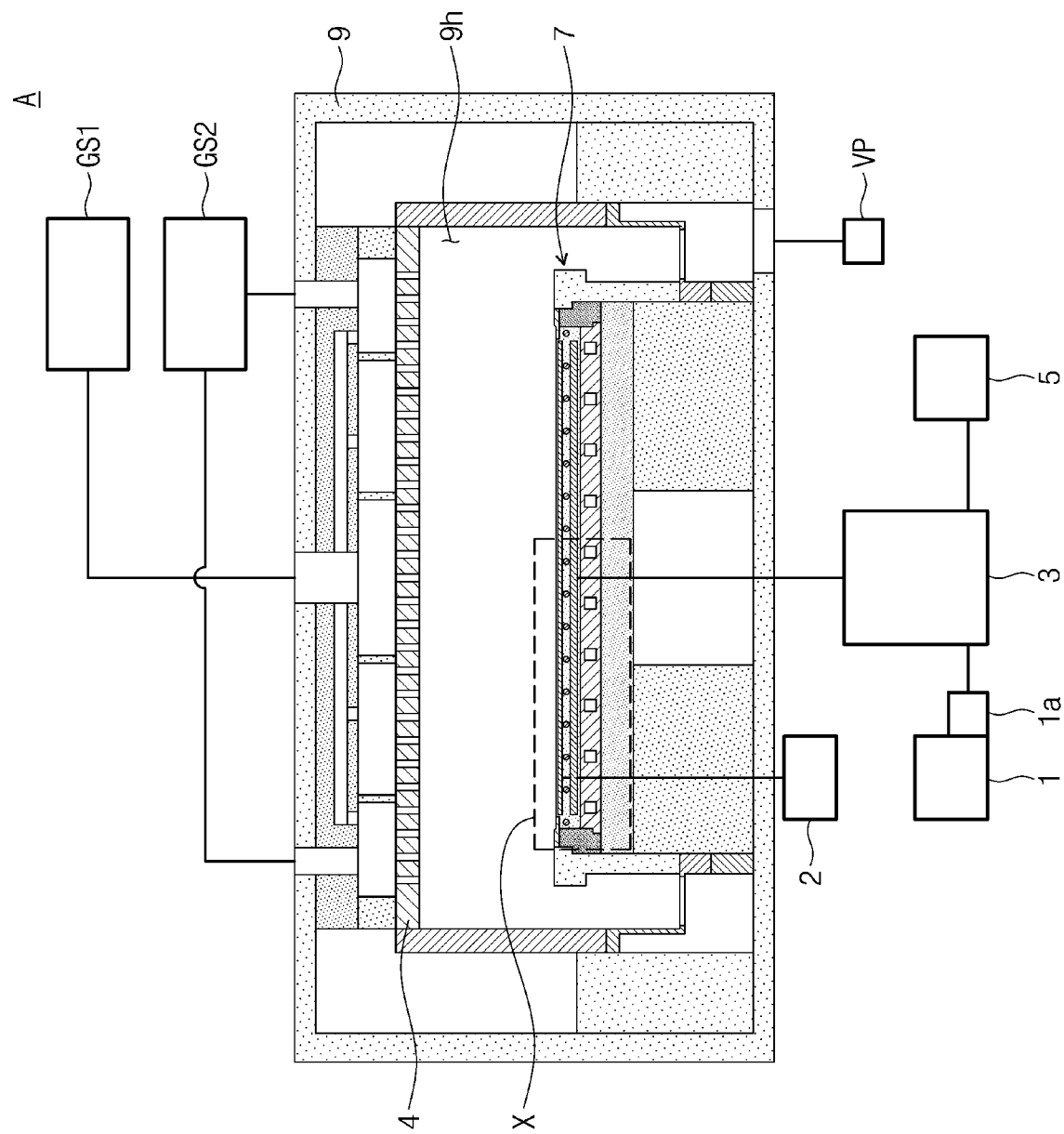
FIG. 1 is a sectional view illustrating a substrate treatment apparatus according to an embodiment of the inventive concept.

Example embodiments of the inventive concepts will now be described more fully with reference to the accompanying drawings, in which example embodiments are shown. Like reference numerals in the drawings denote like elements, and thus their description will be omitted.

FIG. 1 is a sectional view illustrating a substrate treatment apparatus according to an embodiment of the inventive concept.

Referring to FIG. 1, a substrate treatment apparatus A be provided. The substrate treatment apparatus A may be configured to perform a plasma-based process on a substrate. For example, the substrate treatment apparatus A may be configured to perform an etching process on the substrate.

For example, the substrate treatment apparatus A may be an etching chamber. More specifically, the substrate treatment apparatus A may be a capacitively-coupled plasma (CCP) apparatus, as shown in FIG. 1. However, the inventive concept is not limited to this example, and the substrate treatment apparatus A may include an inductively-coupled plasma (ICP) apparatus. For convenience in description, the following description will refer to an example, in which the CCP apparatus is used as the substrate treatment apparatus A. In the present specification, the term 'substrate' may mean a semiconductor wafer, for example, a silicon wafer, but the inventive concept is not limited to this example. The substrate treatment apparatus A may include a substrate treatment chamber 9, a chucking stage 7, a shower head 4, a non-sinusoidal generator 1, a sinusoidal generator 5, a mixer 3, a first gas supplying device GS1, a second gas supplying device GS2, a DC power generator 2, and a vacuum pump VP.

The substrate treatment chamber 9 may be configured to provide a process space 9h. The process space 9h may be isolated from an external space. The process space 9h may be connected to the vacuum pump VP or the like.

The chucking stage 7 may be placed in the substrate treatment chamber 9. The chucking stage 7 may be configured to support the substrate. More specifically, the chucking stage 7 may be configured to fasten the substrate to a specific position. A process may be performed on the substrate, which is fixedly placed on the chucking stage 7. For this, the chucking stage 7 may include an electrostatic chuck (ESC). The chucking stage 7 will be described in more detail below.

The shower head 4 may be placed in the process space 9h. The shower head 4 may be separated from the chucking stage 7 in an upward direction. A process gas may be uniformly supplied onto the chucking stage 7 through a plurality of holes, which are formed in the shower head 4.

The non-sinusoidal generator 1 may be configured to supply a non-sinusoidal wave to the chucking stage 7. The non-sinusoidal generator 1 may generate the non-sinusoidal wave. For example, the non-sinusoidal generator 1 may be configured to generate a non-sinusoidal wave of about 200 kHz to about 600 kHz and supply it to the chucking stage 7. In an embodiment, the non-sinusoidal generator 1 may supply a non-sinusoidal wave of about 400 kHz to the chucking stage 7. For this, the non-sinusoidal generator 1 may include a non-sinusoidal wave power or the like. In an embodiment, the non-sinusoidal generator 1 may have a bipolar output structure. For example, the non-sinusoidal generator 1 may generate a non-sinusoidal wave which transitions between a positive voltage level and a negative voltage level. This may make it possible to improve the anisotropy of ions. The non-sinusoidal generator 1 may be placed outside the process space 9h. That is, the non-sinusoidal generator 1 may be placed outside the substrate treatment chamber 9. For example, the non-sinusoidal generator 1 may be placed below the substrate treatment chamber 9. More specifically, the non-sinusoidal generator 1 may be placed below the chucking stage 7. However, the inventive concept is not limited to this example. A multi-function unit (MFU) 1a may be further provided between the non-sinusoidal generator 1 and the mixer 3. For example, the MFU 1a may be used to prevent the non-sinusoidal generator 1 from being transmitted a harmonic wave generated in the substrate treatment chamber. Here, the harmonic is a wave with a frequency that is a positive integer multiple of a frequency of the original periodic signal generated from the sinusoidal generator 5. One or more inductors may be included in the MFU 1a, thereby inductors included in the mixer 3 may be reduced. The non-sinusoidal wave, which is generated by the non-sinusoidal generator 1, may be transmitted to the mixer 3 through the MFU 1a.

The sinusoidal generator 5 may be configured to supply a sinusoidal wave to the chucking stage 7. The sinusoidal generator 5 may generate the sinusoidal wave. For example, the sinusoidal generator 5 may be configured to generate a sinusoidal wave of about 50 MHz to about 70 MHz to the chucking stage 7. In an embodiment, the sinusoidal generator 5 may supply a radio frequency (RF) wave of about 60 MHz to the chucking stage 7. For this, the sinusoidal generator 5 may include a sinusoidal wave power or the like. The sinusoidal generator 5 may be placed outside the process space 9h. That is, the sinusoidal generator 5 may be placed outside the substrate treatment chamber 9. For example, the sinusoidal generator 5 may be placed below the substrate treatment chamber 9. More specifically, the sinusoidal generator 5 may be placed below the chucking stage 7. However, the inventive concept is not limited to this example.

The mixer 3 may be placed between the sinusoidal generator 5 and the chucking stage 7. The mixer 3 may be placed between the non-sinusoidal generator 1 and the chucking stage 7. The mixer 3 may be placed between the sinusoidal generator 5 and the non-sinusoidal generator 1. The sinusoidal and non-sinusoidal waves, which are respectively generated by the sinusoidal and non-sinusoidal generators 5 and 1, may be transmitted to the chucking stage 7 through the mixer 3. The mixer 3 will be described in more detail below.

Each of the first and second gas supplying devices GS1 and GS2 may be configured to supply a process gas to the process space 9h. The process gas, which is supplied from each of the first and second gas supplying devices GS1 and GS2, may be supplied to a space on the chucking stage 7 through the shower head 4. The process gases, which are respectively supplied from the first and second gas supplying devices GS1 and GS2, may be different from each other, but the inventive concept is not limited to this example.

The DC power generator 2 may be provided to supply a DC power to the chucking stage 7. The DC power, which is supplied by the DC power generator 2, may be used to fasten the substrate to a top surface of the chucking stage 7. The DC power generator 2 will be described in more detail below.

The vacuum pump VP may be connected to the process space 9h. The vacuum pump VP may be configured to suction a fluidic material from the process space 9h.

Figure 2:
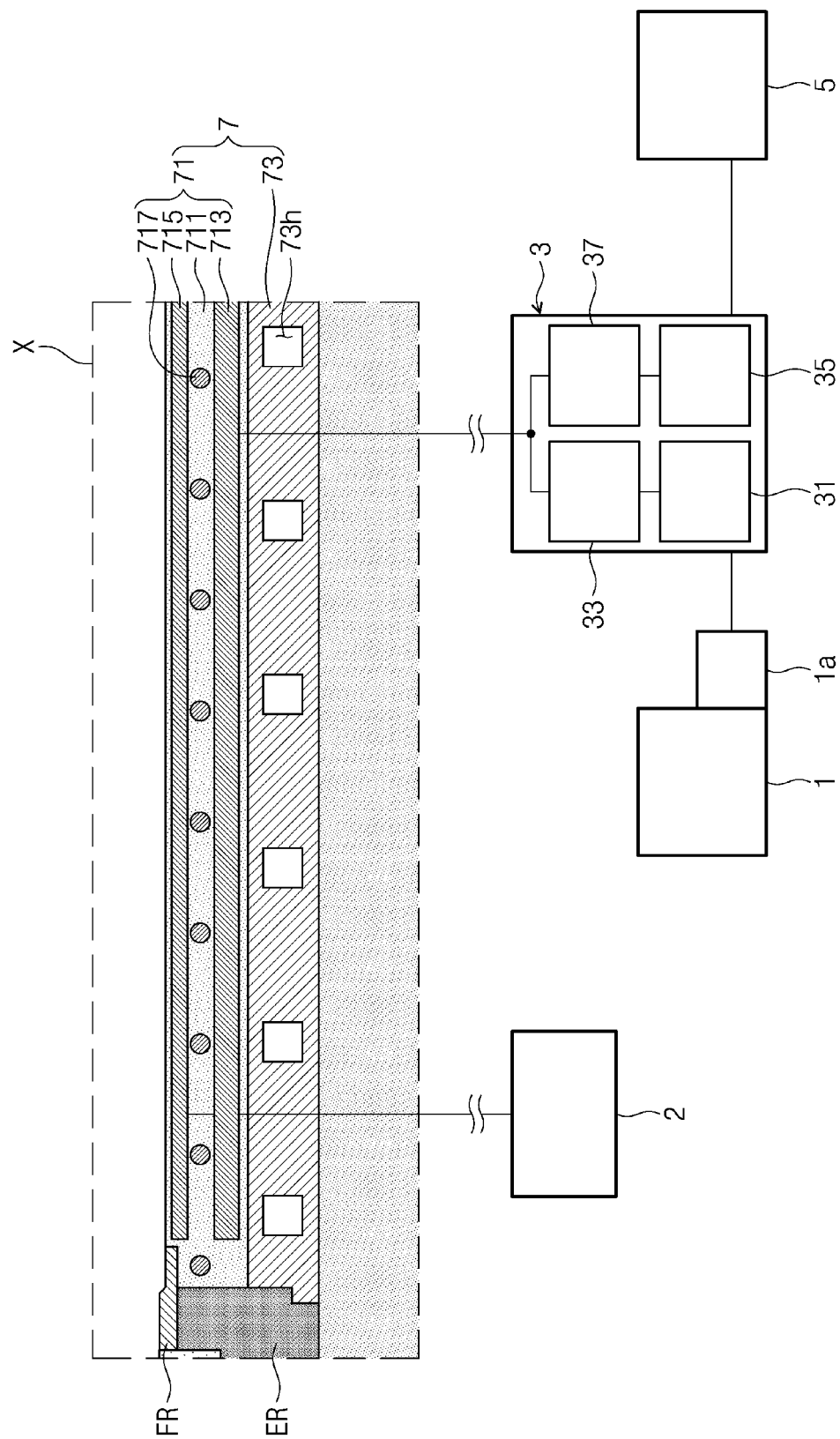
FIG. 2 is an enlarged sectional view illustrating a portion 'X' of FIG. 1 according to example embodiments.

FIG. 2 is an enlarged sectional view illustrating a portion 'X' of FIG. 1 according to example embodiments.

Referring to FIG. 2, the chucking stage 7 may include a chuck 71, a cooling plate 73, and a plasma power delivery rod.

A substrate may be disposed on the chuck 71. The chuck 71 may be configured to fasten the substrate to a specific position. For this, the chuck 71 may include a chuck body 711, a plasma electrode 713, a chucking electrode 715, and a heater 717.

The chuck body 711 may have a shape of circular pipe or cylinder. The chuck body 711 may be formed of or include a ceramic material, but the inventive concept is not limited to this example. The substrate may be disposed on a top surface of the chuck body 711. A focus ring FR and/or an edge ring ER may be provided to enclose the chuck body 711.

The plasma electrode 713 may be placed in the chuck body 711. The plasma electrode 713 may be formed of or include aluminum (Al) or the like. The plasma electrode 713 may have a circular-plate shape, but the inventive concept is not limited to this example.

The chucking electrode 715 may be placed in the chuck body 711. The chucking electrode 715 may be placed on the plasma electrode 713. A DC power may be applied to the chucking electrode 715. More specifically, the DC power generator 2 may be configured to apply a DC power to the chucking electrode 715. The substrate on the chuck body 711 may be fastened to a specific position by the DC power applied to the chucking electrode 715. The chucking electrode 715 may be formed of or include aluminum (Al) or the like, but the inventive concept is not limited to this example.

The heater 717 may be placed in the chuck body 711. The heater 717 may be placed between the chucking electrode 715 and the plasma electrode 713. The heater 717 may include a heating line. For example, the heater 717 may include a heating line, which is provided in a concentric manner. The heater 717 may dissipate heat energy toward neighboring elements. Accordingly, the chuck body 711 or the like may be heated.

The cooling plate 73 may be placed below the chuck 71. In other words, the chuck 71 may be placed on the cooling plate 73. The cooling plate 73 may be configured to have a cooling hole 73h. Cooling water may flow through the cooling hole 73h. The cooling water in the cooling hole 73h may absorb heat energy from the cooling plate 73.

The plasma power delivery rod may connect the mixer 3 to the plasma electrode 713. The plasma power delivery rod may be extended from the plasma electrode 713 in a downward direction. For example, the plasma power delivery rod may be extended downward from a center region of a bottom surface of the plasma electrode 713 and may be connected to the mixer 3. The plasma power delivery rod may be formed of or include copper (Cu) and/or aluminum (Al), but the inventive concept is not limited to this example.

The mixer 3 may be placed between each of the non-sinusoidal and sinusoidal generators 1 and 5 and the plasma electrode 713. The mixer 3 may include a low pass filter 31, a band stop filter 33, a high pass filter 37, and a matcher 35.

The low pass filter 31 may be placed between the non-sinusoidal generator 1 and the plasma electrode 713. The low pass filter 31 may be configured to allow for selective transmission of a low frequency wave. In other words, a high frequency wave may not pass through the low pass filter 31. The sinusoidal wave, which is generated by the sinusoidal generator 5, may not pass through the low pass filter 31. A harmonic wave, which is generated in the chucking stage 7, may not pass through the low pass filter 31. Thus, the harmonic wave generated in the chucking stage 7 may not transmit to the non-sinusoidal generator 1. The non-sinusoidal wave, which is generated by the non-sinusoidal generator 1, may pass through the low pass filter 31. The non-sinusoidal wave passing through the low pass filter 31 may be transmitted to the band stop filter 33.

The band stop filter 33 may be placed between the low pass filter 31 and the plasma electrode 713. The non-sinusoidal wave, which is generated by the non-sinusoidal generator 1, may pass through the band stop filter 33. The sinusoidal wave, which is generated by the sinusoidal generator 5, may not pass through the band stop filter 33. Thus, the sinusoidal wave, which is generated by the sinusoidal generator 5, may be transmitted to the plasma electrode 713.

The high pass filter 37 may be placed between the sinusoidal generator 5 and the plasma electrode 713. More specifically, the high pass filter 37 may be placed between the matcher 35 and the plasma electrode 713. The high pass filter 37 may be configured to allow for selective transmission of a high frequency wave. In other words, a low frequency wave may not pass through the high pass filter 37. The non-sinusoidal wave, which is generated by the non-sinusoidal generator 1, may not pass through the high pass filter 37. Thus, the non-sinusoidal wave, which is generated by the non-sinusoidal generator 1, may be transmitted to the plasma electrode 713 through the low pass filter 31 and the band stop filter 33. The sinusoidal wave, which is generated by the sinusoidal generator 5, may pass through the high pass filter 37. The matcher 35 may be placed between the sinusoidal generator 5 and the plasma electrode 713. The sinusoidal wave passing through the matcher 35 may be transmitted to the plasma electrode 713 through the high pass filter 37. For example, the matcher 35 may perform impedance matching between an electric circuit, which is formed by a top electrode and a bottom electrode (e.g., the plasma electrode 713) in a process (e.g., a plasma treatment process) performed in the substrate treatment chamber 9, and the sinusoidal generator 5.

Figure 3:
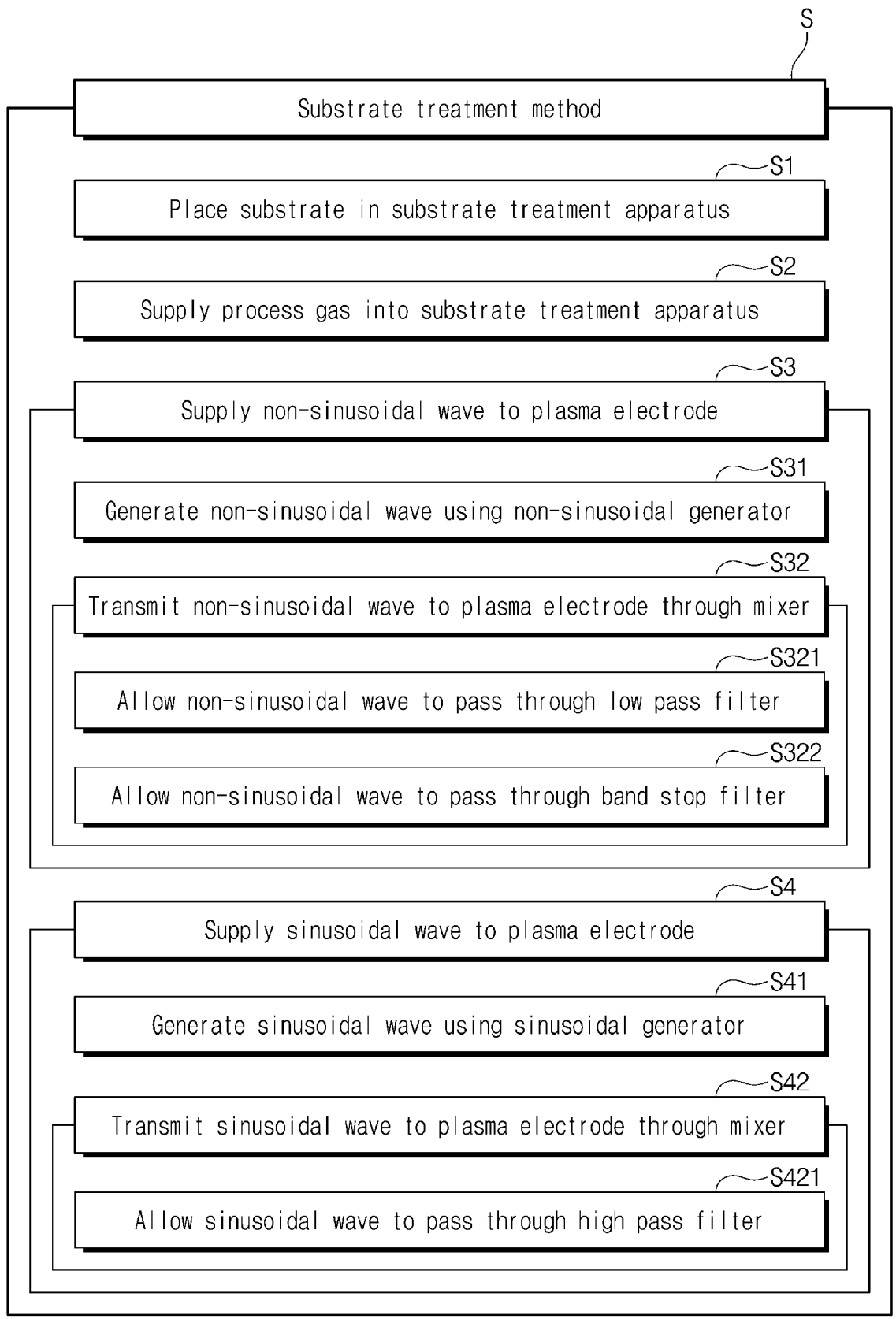
FIG. 3 is a flow chart illustrating a substrate treatment method according to an embodiment of the inventive concept.

FIG. 3 is a flow chart illustrating a substrate treatment method or a semiconductor device manufacturing method according to an embodiment of the inventive concept.

Referring to FIG. 3, a substrate treatment method or a semiconductor device manufacturing method S may be used for a process of treating the substrate in the substrate treatment apparatus A described with reference to FIGS. 1 and 2. Since the same reference numerals as in the above-described embodiment have the same configuration, detailed description thereof will be omitted.

The method S may include placing a substrate in a substrate treatment apparatus A (in S1), supplying a process gas into the substrate treatment apparatus A (in S2), supplying a non-sinusoidal wave to a plasma electrode 713 (in S3), and supplying a sinusoidal wave to the plasma electrode (in S4).

The supplying of the non-sinusoidal wave to the plasma electrode 713 (in S3) may include generating the non-sinusoidal wave using a non-sinusoidal generator 1 (in S31) and transmitting the non-sinusoidal wave to the plasma electrode 713 through a mixer 3 (in S32).

The transmission of the non-sinusoidal wave to the plasma electrode 713 through the mixer 3 (S32) may include allowing the non-sinusoidal wave to pass through a low pass filter 31 (in S321) and allowing the non-sinusoidal wave to pass through a band stop filter 33 (in S322).

The supplying of the sinusoidal wave to the plasma electrode 713 (in S4) may include generating a sinusoidal wave in a sinusoidal generator 5 (in S41) and transmitting the sinusoidal wave to the plasma electrode 713 through the mixer 3 (in S42).

The transmission of the sinusoidal wave to the plasma electrode 713 through the mixer 3 (in S42) may include allowing the sinusoidal wave to pass through a high pass filter 37 (in S421).

The supplying of the non-sinusoidal wave to the plasma electrode 713 (in S3) and the supplying of the sinusoidal wave to the plasma electrode 713 (in S4) may be performed simultaneously. This will be described in more detail below.

In the afore-described embodiment, the supplying of the process gas into the substrate treatment apparatus A (in S2) has been described as a step performed before the supplying of the non-sinusoidal wave to the plasma electrode 713 (in S3) and the supplying of the sinusoidal wave to the plasma electrode 713 (in S4), but the inventive concept is not limited to this example. That is, the order of the steps may be switched.

Hereinafter, the semiconductor device manufacturing method S of FIG. 3 will be described in more detail with reference to FIGS. 4 to 9.

FIGS. 4 to 9 are diagrams illustrating a substrate treatment method or a semiconductor device manufacturing method according to the flow chart of FIG. 3 according to example embodiments.

Figure 4:
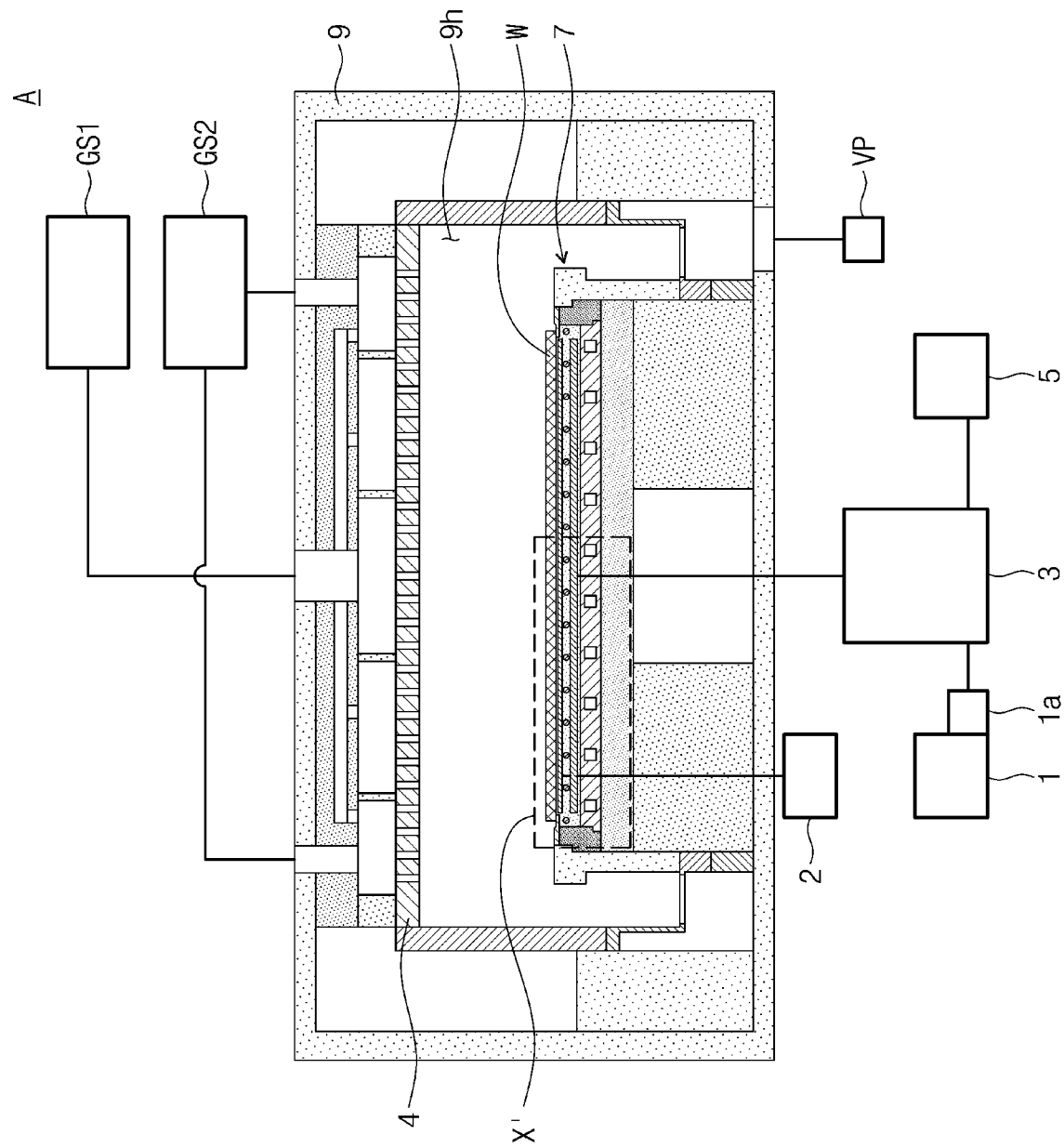
FIGS. 4 to 9 are diagrams illustrating a substrate treatment method according to the flow chart of FIG. 3 according to example embodiments.
Figure 5:
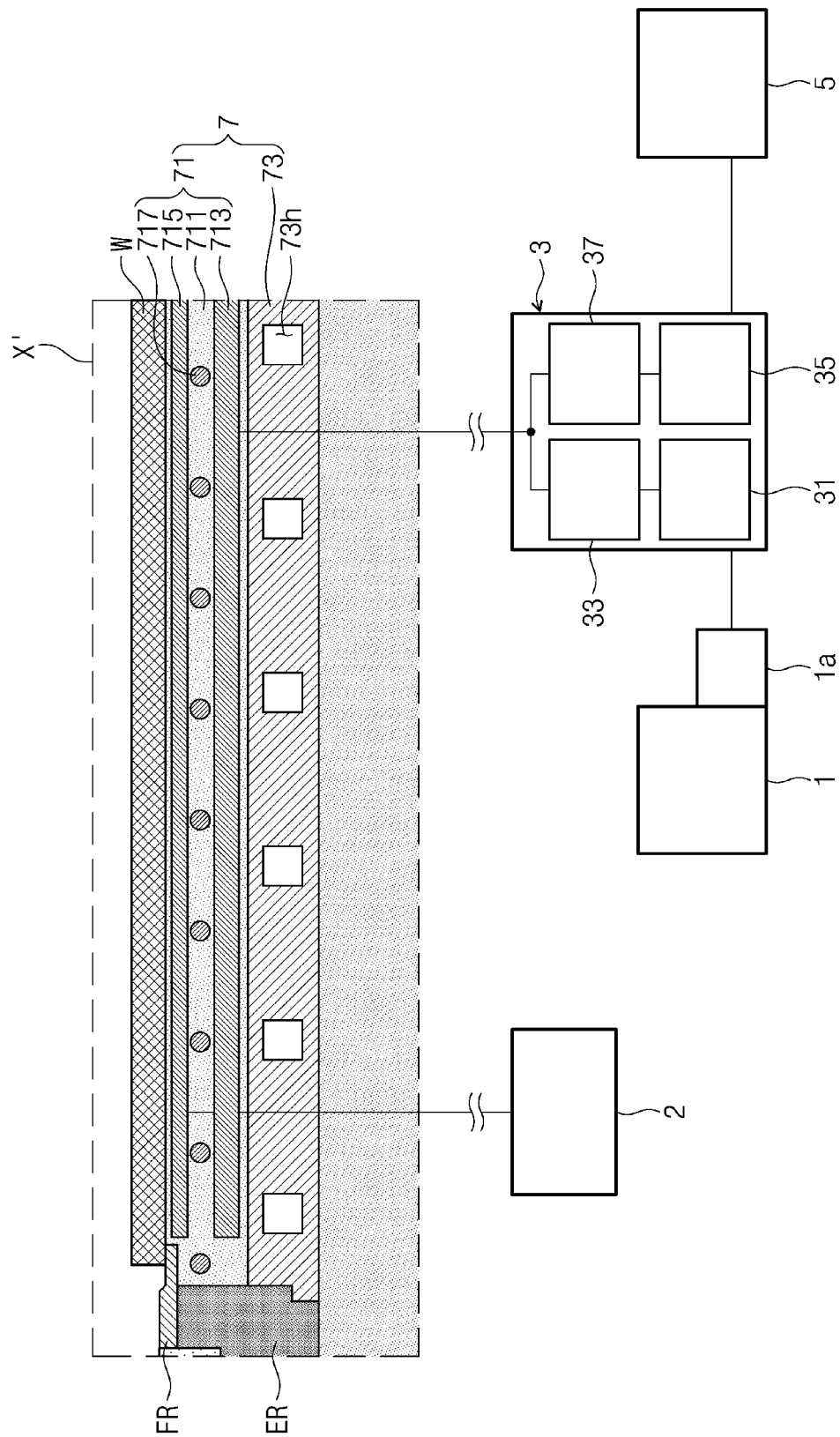

Referring to FIGS. 3 to 5, the placing of the substrate in the substrate treatment apparatus A (in S1) may include placing a substrate (or, a wafer) W on the chucking stage 7. The substrate W may be fastened to the top surface of the chucking stage 7. More specifically, the DC power is applied to the chucking electrode 715 from the DC power generator 2, the chucking electrode 715 may fasten the substrate W to the top surface of the chuck body 711 using an electrostatic force.

Figure 6:
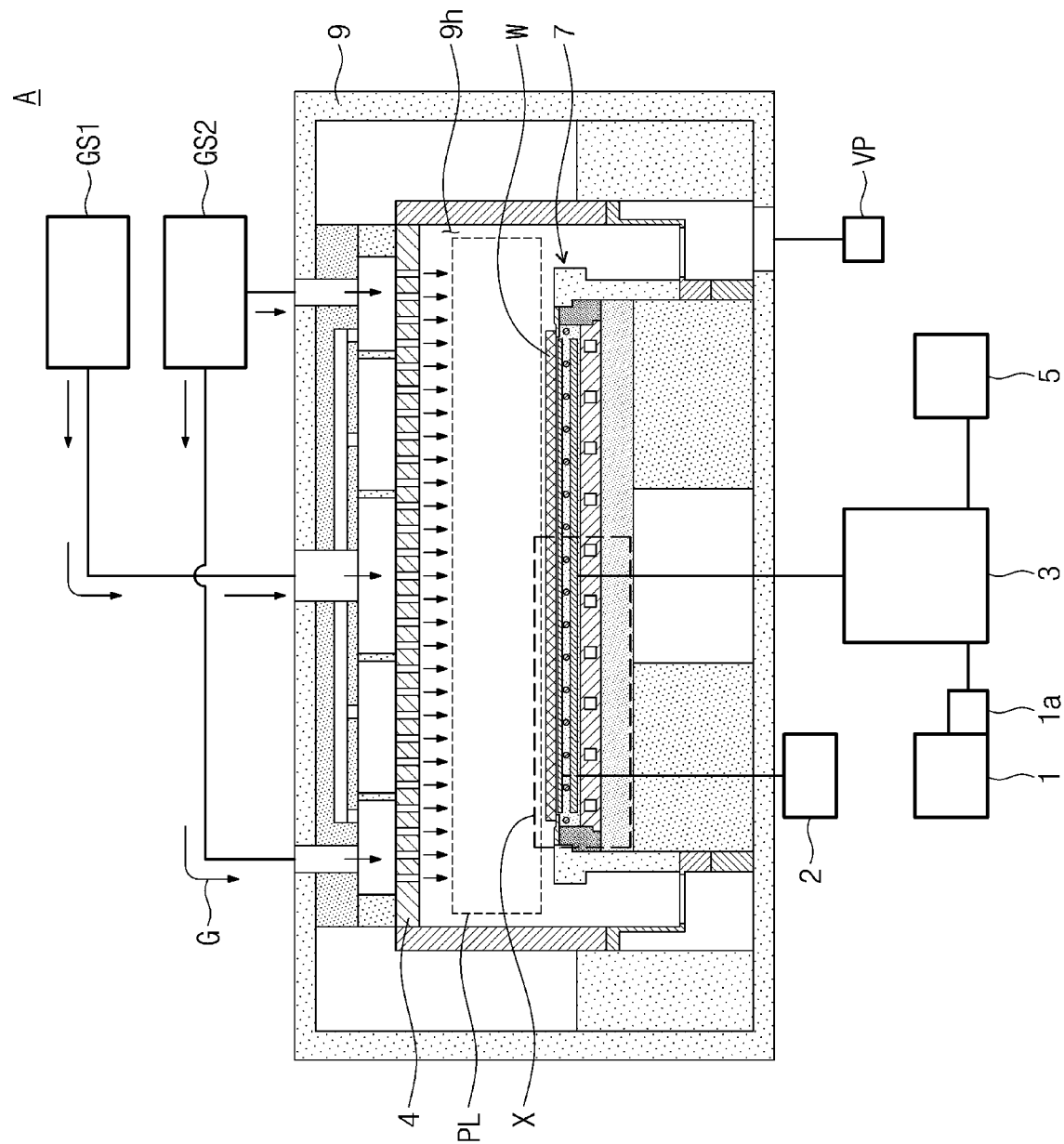

Referring to FIGS. 3 and 6, the supplying of the process gas into the substrate treatment apparatus A (in S2) may include sending a process gas G, which is supplied from the first gas supplying device GS1 and/or the second gas supplying device GS2, into the process space 9h. The process gas G may be uniformly supplied onto the substrate W through the shower head 4.

Figure 7:
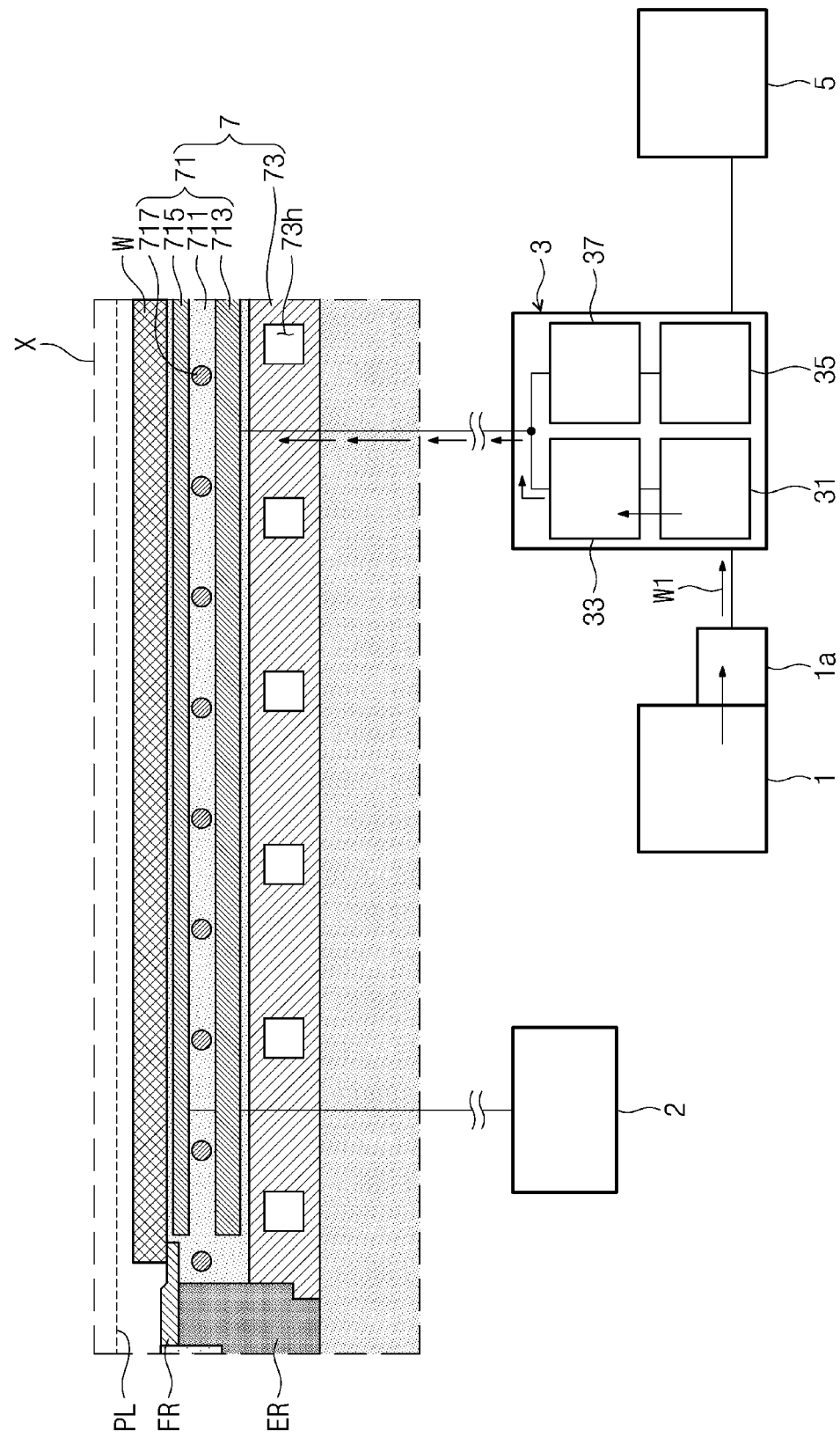

Referring to FIGS. 3 and 7, the generating of the non-sinusoidal wave using the non-sinusoidal generator 1 (in S31) may include generating a non-sinusoidal wave W1 of about 200 kHz to about 600 kHz using the non-sinusoidal generator 1. The non-sinusoidal wave W1 may be transmitted to the mixer 3 through the MFU 1a.

The allowing of the non-sinusoidal wave to pass through the low pass filter 31 (in S321) may include allowing the non-sinusoidal wave W1, which is generated from the non-sinusoidal generator 1, to pass through the low pass filter 31. The non-sinusoidal wave W1 passing through the low pass filter 31 may be transmitted to the band stop filter 33.

The allowing of the non-sinusoidal wave to pass through the band stop filter 33 (in S322) may include allowing the non-sinusoidal wave W1, which is output from the low pass filter 31, to pass through the band stop filter 33. The non-sinusoidal wave W1 passing through the band stop filter 33 may not pass through the high pass filter 37. Thus, the non-sinusoidal wave W1 passing through the band stop filter 33 may be supplied to the plasma electrode 713 through the plasma power delivery rod. An electric field may be produced in the process space 9h (e.g., see FIG. 6) by the non-sinusoidal wave W1, which is transmitted to the plasma electrode 713. Accordingly, plasma PL may be generated from the process gas G (e.g., see FIG. 6) in the process space 9h. In an embodiment, the plasma PL generated in the process space 9h may be controlled.

Figure 8:
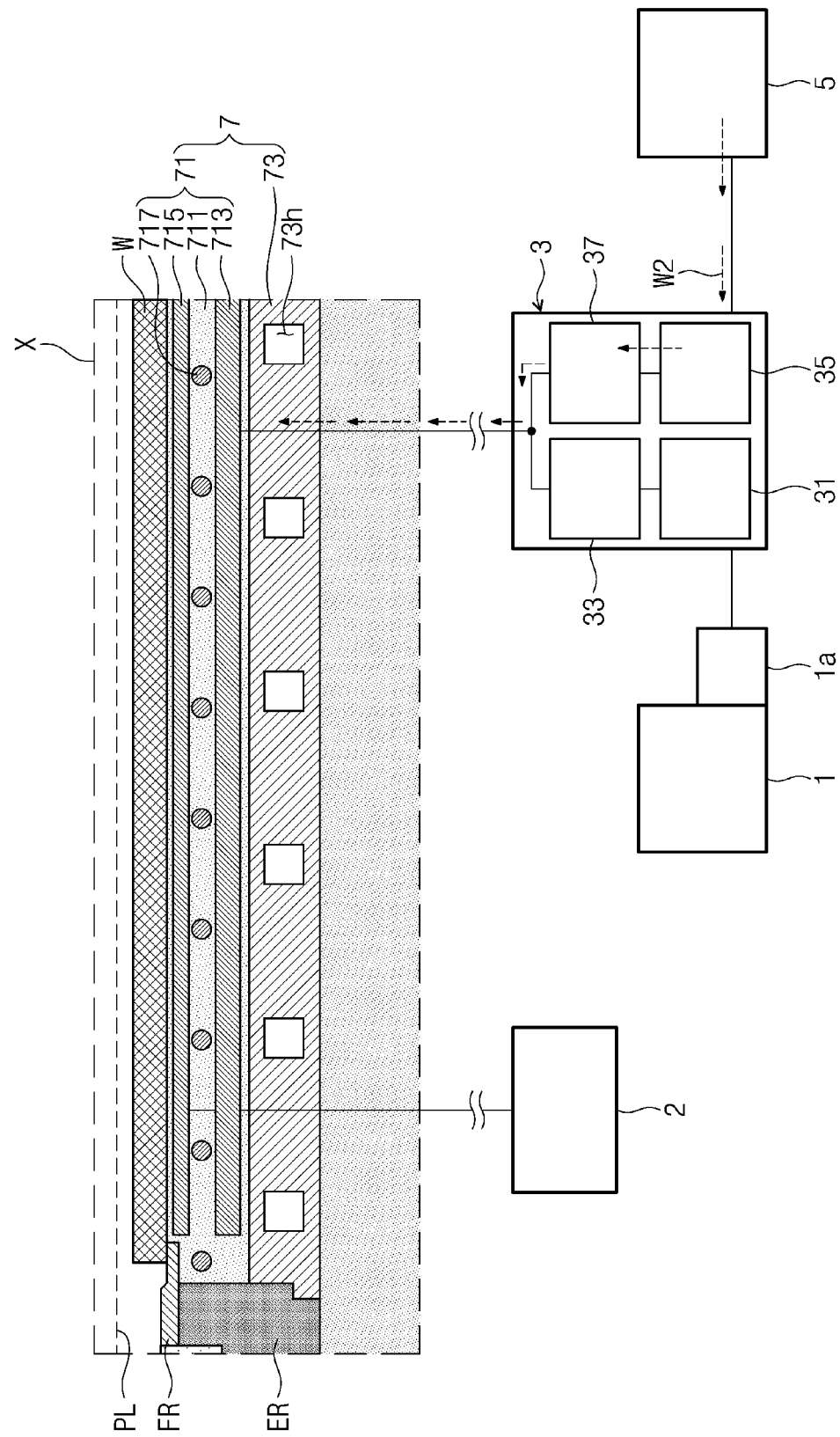

Referring to FIGS. 3 and 8, the generation of the sinusoidal wave in the sinusoidal generator 5 (in S41) may include generating a sinusoidal wave W2 of about 50 MHz to about 70 MHz using the sinusoidal generator 5. The sinusoidal wave W2 may be transmitted to the high pass filter 37 through the matcher 35.

The allowing of the sinusoidal wave to pass through the high pass filter (in S421) may include allowing the sinusoidal wave W2, which is output from the matcher 35, to pass through the high pass filter 37. The sinusoidal wave W2 passing through the high pass filter 37 may not pass through the band stop filter 33. Thus, the sinusoidal wave W2 passing through the high pass filter 37 may be supplied to the plasma electrode 713 through the plasma power delivery rod. An electric field may be produced in the process space 9h (e.g., see FIG. 6) by the sinusoidal wave W2, which is transmitted to the plasma electrode 713. Accordingly, the plasma PL may be generated from the process gas G (e.g., see FIG. 6) in the process space 9h. In an embodiment, the plasma PL generated in the process space 9h may be controlled.

Figure 9:
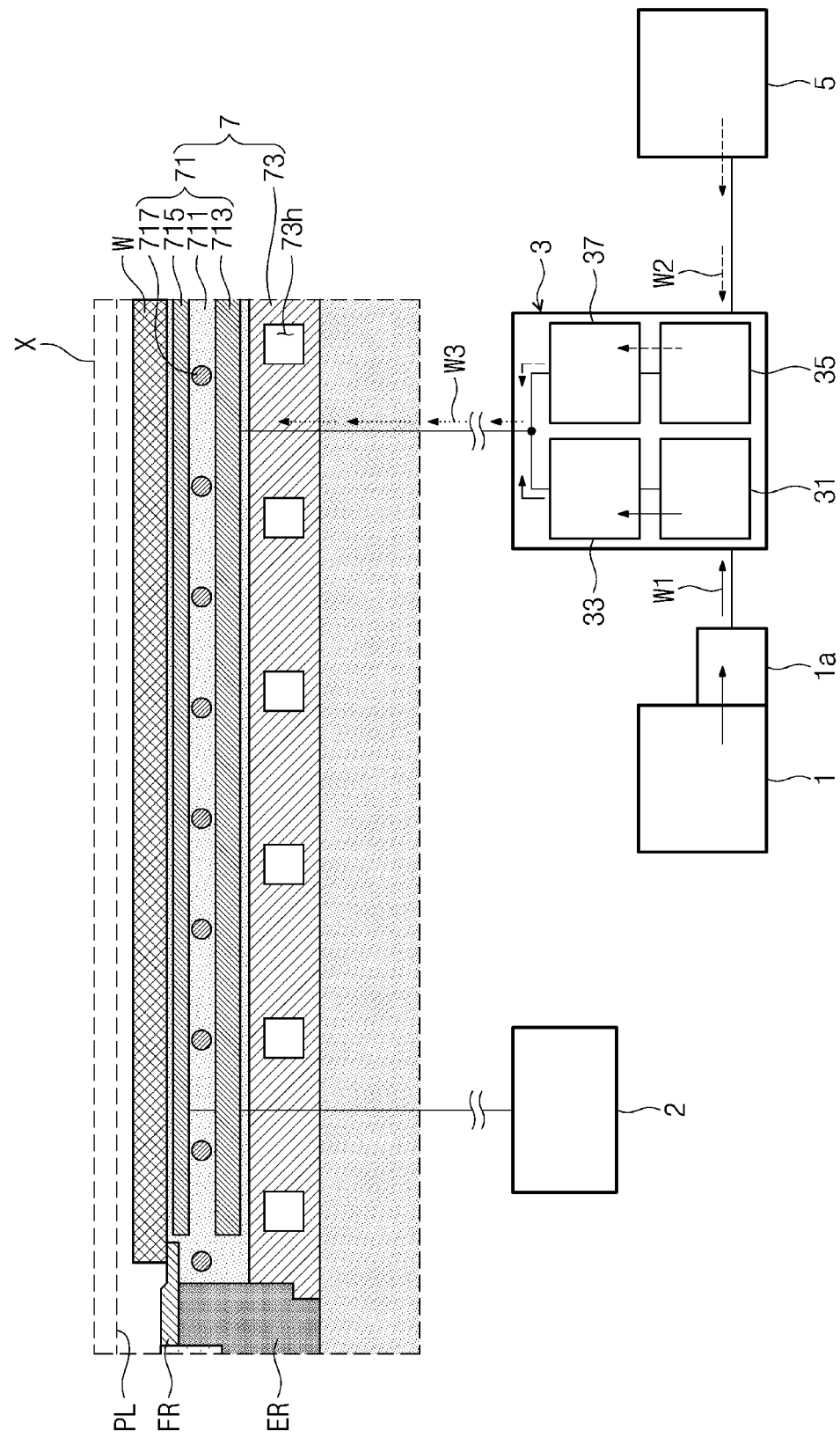

Referring to FIGS. 3 and 9, the supplying of the non-sinusoidal wave to the plasma electrode 713 (in S3) and the supplying of the sinusoidal wave to the plasma electrode 713 (in S4) may be performed simultaneously. For example, the non-sinusoidal wave W1 and the sinusoidal wave W2, which are respectively generated by the non-sinusoidal generator 1 and the sinusoidal generator 5, may be mixed with each other in the mixer 3. A mixed wave W3 may transmitted to the plasma electrode 713 through the plasma power delivery rod.

In a substrate treatment apparatus according to an embodiment of the inventive concept and a substrate treatment method using the same, both of sinusoidal and non-sinusoidal waves may be applied to a single plasma electrode. Thus, it may be possible to simplify an overall structure of the apparatus. In addition, it may be possible to prevent an interference issue, which may occur when two plasma electrodes are used.

In a substrate treatment apparatus according to an embodiment of the inventive concept and a substrate treatment method using the same, two filters may be used to prevent transmission of a harmonic wave. More specifically, a harmonic wave, which is generated in a substrate treatment chamber, may be blocked by a band stop filter and/or a low pass filter.

In a substrate treatment apparatus according to an embodiment of the inventive concept and a substrate treatment method using the same, waves of various frequencies may be applied without any switch structure. For example, since various filters are used for frequency filtering, it may be possible to apply waves of various frequencies to a single plasma electrode through a single mixer, without an additional control device.

In a substrate treatment apparatus according to an embodiment of the inventive concept and a substrate treatment method using the same, sinusoidal and non-sinusoidal waves may be applied to a single electrode.

In a substrate treatment apparatus according to an embodiment of the inventive concept and a substrate treatment method using the same, it may be possible to suppress a harmonic wave.

In a substrate treatment apparatus according to an embodiment of the inventive concept and a substrate treatment method using the same, it may be possible to prevent sinusoidal and non-sinusoidal waves from being leaked.

In a substrate treatment apparatus according to an embodiment of the inventive concept and a substrate treatment method using the same, various operations may be performed without an addition control.

While example embodiments of the inventive concept have been particularly shown and described, it will be understood by one of ordinary skill in the art that variations in form and detail may be made therein without departing from the spirit and scope of the attached claims.

What is claimed is:
1. A substrate treatment apparatus, comprising:
a chucking stage supporting a substrate;
a sinusoidal generator configured to supply a sinusoidal wave to the chucking stage;
a non-sinusoidal generator configured to supply a non-sinusoidal wave to the chucking stage; and a mixer between each of the sinusoidal and non-sinusoidal generators and the chucking stage,
wherein the chucking stage comprises:
a chuck body; and
a plasma electrode in the chuck body, and
wherein the mixer comprises:
a high pass filter placed between the sinusoidal generator and the plasma electrode, and configured to receive the sinusoidal wave from the sinusoidal generator and transmit the sinusoidal wave to the plasma electrode;
a low pass filter placed between the non-sinusoidal generator and the plasma electrode, and configured to receive the non-sinusoidal wave from the non-sinusoidal generator; and
a band stop filter placed between the low pass filter and the plasma electrode, and configured to receive the non-sinusoidal wave from the low pass filter and transmit the non-sinusoidal wave to the plasma electrode.

2. The substrate treatment apparatus of claim 1, wherein the chucking stage further comprises:
a chucking electrode placed at a level higher than the plasma electrode in the chuck body.

3. The substrate treatment apparatus of claim 2, further comprising:
a DC power generator configured to supply a DC power to the chucking electrode.

4. The substrate treatment apparatus of claim 2, wherein the chucking stage further comprises:
a heater placed between the chucking electrode and the plasma electrode in the chuck body.

5. The substrate treatment apparatus of claim 1, wherein the chucking stage further comprises:
a plasma power delivery rod connected to the mixer by extending downward from the plasma electrode, and configured to supply the sinusoidal wave and the non-sinusoidal wave from the mixer to the plasma electrode.

6. The substrate treatment apparatus of claim 1, wherein the non-sinusoidal wave has a frequency of 200 kHz to 600 kHz, and
wherein the sinusoidal wave has a frequency of 50 MHz to 70 MHz.

7. The substrate treatment apparatus of claim 1, further comprising:
a substrate treatment chamber configured to provide a process space,
wherein the chucking stage is placed in the substrate treatment chamber, and
each of the sinusoidal and non-sinusoidal generators is placed outside the substrate treatment chamber.

8. The substrate treatment apparatus of claim 1, wherein the non-sinusoidal generator has a bipolar output structure.

9. A substrate treatment apparatus, comprising:
a substrate treatment chamber configured to provide a process space;
a chucking stage placed in the substrate treatment chamber, supporting a substrate, and including a plasma electrode;
a sinusoidal generator configured to supply a sinusoidal wave to the plasma electrode;
a non-sinusoidal generator configured to supply a non-sinusoidal wave to the plasma electrode; and
a mixer connected to each of the sinusoidal and non-sinusoidal generators,
wherein the mixer comprises:
a low pass filter placed between the non-sinusoidal generator and the plasma electrode, and configured to receive the non-sinusoidal wave from the non-sinusoidal generator; and
a band stop filter placed between the low pass filter and the plasma electrode, and configured to receive the non-sinusoidal wave from the low pass filter.

10. The substrate treatment apparatus of claim 9, wherein the mixer further comprises:
a high pass filter placed between the sinusoidal generator and the plasma electrode, and configured to receive the sinusoidal wave from the sinusoidal generator.

11. The substrate treatment apparatus of claim 9, further comprising:
a shower head, which is placed in the process space and is spaced apart from the chucking stage in an upward direction.

12. The substrate treatment apparatus of claim 9, wherein the sinusoidal generator, the non-sinusoidal generator, and the mixer are placed outside the process space.

13. The substrate treatment apparatus of claim 12, wherein the chucking stage is placed in a lower portion of the process space, and wherein the mixer is placed below the substrate treatment chamber.

14. The substrate treatment apparatus of claim 9, wherein the chucking stage further comprises:
a chuck body supporting the substrate;
a chucking electrode in the chuck body; and
a heater placed between the chucking electrode and the plasma electrode in the chuck body.

15. The substrate treatment apparatus of claim 9, wherein the chucking stage further comprises:
a plasma power delivery rod connected to the mixer by extending downward from the plasma electrode, and
wherein the non-sinusoidal wave, which is generated by the non-sinusoidal generator, sequentially pass through the low pass filter, the band stop filter, and the plasma power delivery rod and is supplied to the plasma electrode.

16. A method of manufacturing a semiconductor device, the method comprising:
placing a substrate in substrate treatment apparatus;
supplying a non-sinusoidal wave to a plasma electrode of the substrate treatment apparatus; and
supplying a sinusoidal wave to the plasma electrode, wherein:
the supplying of the non-sinusoidal wave to the plasma electrode includes transmitting the non-sinusoidal wave, which is generated by a non-sinusoidal generator, to the plasma electrode through a mixer,
the supplying of the sinusoidal wave to the plasma electrode includes transmitting the sinusoidal wave, which is generated by a sinusoidal generator, to the plasma electrode through the mixer, and
the transmitting of the non-sinusoidal wave to the plasma electrode through the mixer includes allowing the non-sinusoidal wave, which is generated by the non-sinusoidal generator, to pass through a low pass filter and a band stop filter in the mixer.

17. The method of claim 16, wherein the transmitting of the sinusoidal wave to the plasma electrode through the mixer includes allowing the sinusoidal wave, which is generated by the sinusoidal generator, to pass through a high pass filter in the mixer.

18. The method of claim 16, wherein the transmitting of the non-sinusoidal wave to the plasma electrode through the mixer includes allowing the non-sinusoidal wave, which is generated by the non-sinusoidal generator, to sequentially pass through the low pass filter and the band stop filter.

19. The method of claim 16, wherein the supplying of the non-sinusoidal wave to the plasma electrode and the supplying of the sinusoidal wave to the plasma electrode are performed simultaneously.

20. The method of claim 19, wherein the non-sinusoidal wave and the sinusoidal wave are mixed with each other in the mixer and then are transmitted to the plasma electrode.

* * * * *